(12) United States Patent
Zortman et al.

(10) Patent No.: US 9,081,215 B1
(45) Date of Patent: Jul. 14, 2015

(54) SILICON PHOTONIC HEATER-MODULATOR

(71) Applicant: Sandia Corporation, Albuquerque, NM (US)

(72) Inventors: William A. Zortman, Corrales, NM (US); Douglas Chandler Trotter, Albuquerque, NM (US); Michael R. Watts, Hingham, MA (US)

(73) Assignee: Sandia Corporation, Albuquerque, NM (US)

( * ) Notice: Subject to any disclaimer, the term of this patent is extended or adjusted under 35 U.S.C. 154(b) by 290 days.

(21) Appl. No.: 13/769,082

(22) Filed: Feb. 15, 2013

Related U.S. Application Data

(60) Provisional application No. 61/599,759, filed on Feb. 16, 2012.

(51) Int. Cl.
*G02F 1/035* (2006.01)
*G02F 1/025* (2006.01)
*H01L 21/02* (2006.01)

(52) U.S. Cl.
CPC ............... *G02F 1/025* (2013.01); *H01L 21/02* (2013.01)

(58) Field of Classification Search
None
See application file for complete search history.

(56) References Cited

U.S. PATENT DOCUMENTS

| 7,491,015 | B2 * | 2/2009 | Coppes et al. ............... 405/42 |
| 7,983,517 | B1 * | 7/2011 | Watts et al. .................. 385/32 |
| 2009/0226129 | A1 * | 9/2009 | Kuipers et al. .............. 385/14 |
| 2010/0209038 | A1 * | 8/2010 | Popovic et al. ............... 385/1 |
| 2013/0130254 | A1 * | 5/2013 | Scherer et al. ............ 435/6.11 |

OTHER PUBLICATIONS

Derose et al., "Silicon Microring Modulator with Integrated Heater and Temperature Sensor for Thermal Control", Optical Society of America, 2010.
Ding et al., "Ultra-low-power carrier-depletion Mach-Zehnder silicon optical modulator", Optics Express 20(7), Mar. 26, 2012; pp. 7081-7087.
Dong et al., "Wavelength-tunable silicon microring modulator", Optics Express, 18(11), May 24, 2010; pp. 10941-10946.
Heck et al., "Hybrid Silicon Photonics for Optical Interconnects"<IEEE Journal of Selected Optics in Quantum Electronics, 2010; pp. 1-14.
Héroux et al., "Optical Transmitter With 1060 nm VCSEL for Low Power Interconnect", OSA/OFC/NFOEC, 2011.
Li et al., "25Bg/S 1V-driving CMOS ring modulator with integrated thermal tuning", Optics Express, 19(21), Oct. 10, 2011; pp. 20435-20443.
Watts et al., "Adiabatic Resonant Microrings (ARMs) with Directly Integrated Thermal Microphotonics", OSA/CLEO/IQEC, 2009.
Watts at al, "Vertical junction silicon microdisk modulators and switches", Optics Express 19(22), Oct. 24, 2011; pp. 21989-22003.

(Continued)

*Primary Examiner* — Tina Wong
(74) *Attorney, Agent, or Firm* — Martin I. Finston

(57) ABSTRACT

Photonic modulators, methods of forming photonic modulators and methods of modulating an input optical signal are provided. A photonic modulator includes a disk resonator having a central axis extending along a thickness direction of the disk resonator. The disk resonator includes a modulator portion and a heater portion. The modulator portion extends in an arc around the central axis. A PN junction of the modulator portion is substantially normal to the central axis.

20 Claims, 9 Drawing Sheets

(56) References Cited

OTHER PUBLICATIONS

Xu et al., "12.5 Gbit/s carrier-injection-based silicon micro-ring silicon modulators", Optics Express 15(2), Jan. 22, 2007; pp. 430-436.
Xu et al., "Micrometre-scale silicon electro-optic modulator", Nature vol. 435, May 19, 2005; pp. 325-327.
Zortman et al., "Silicon photonics manufacturing", Optics Express, 16(23), Nov. 8, 2010; pp. 23598-23607.

* cited by examiner

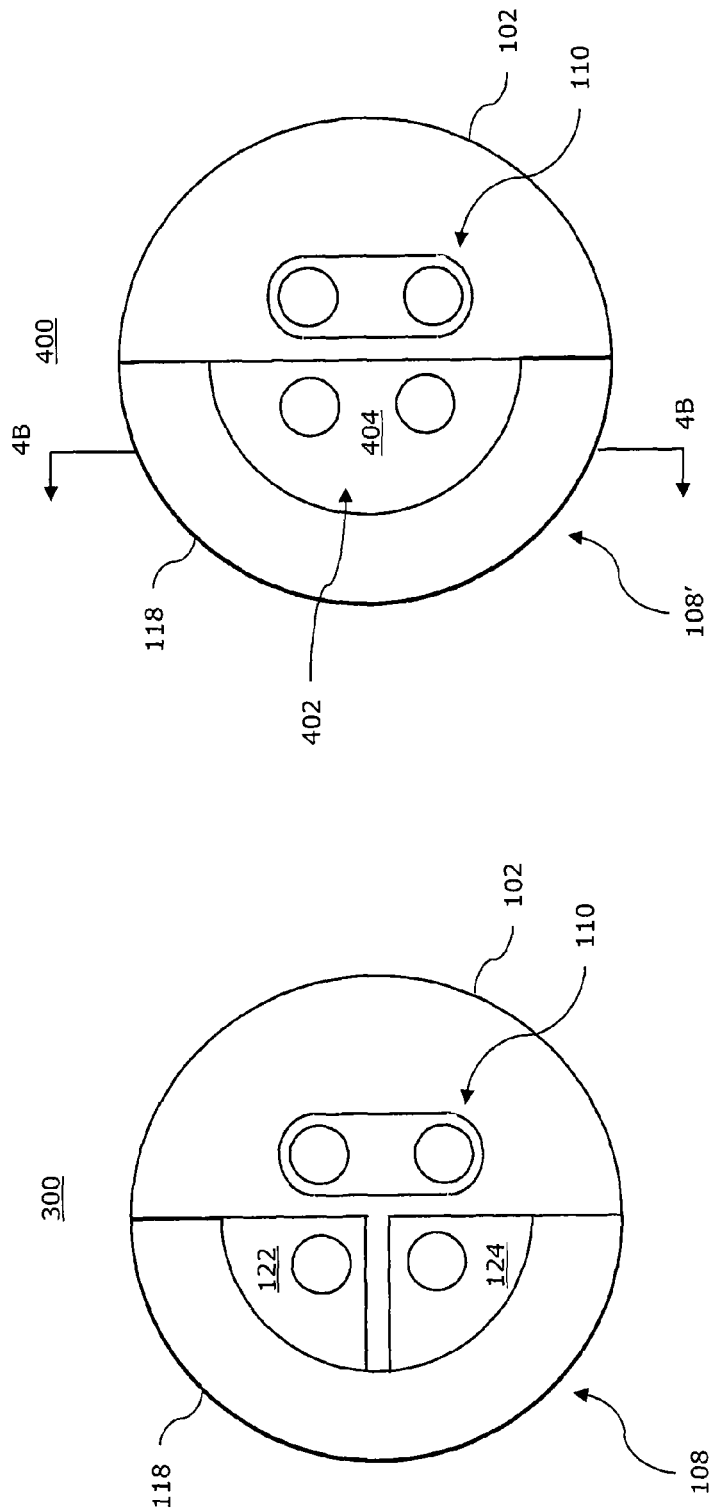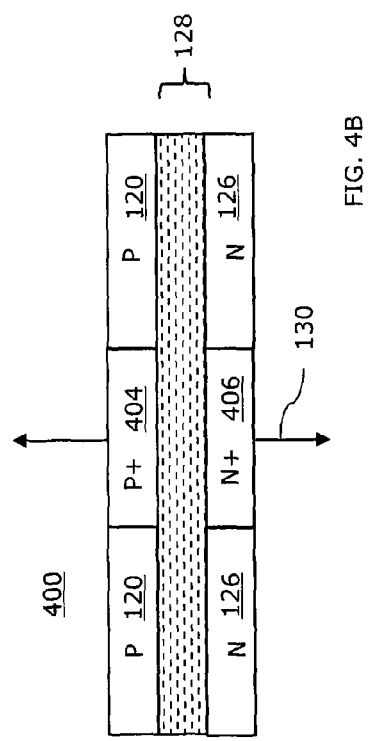

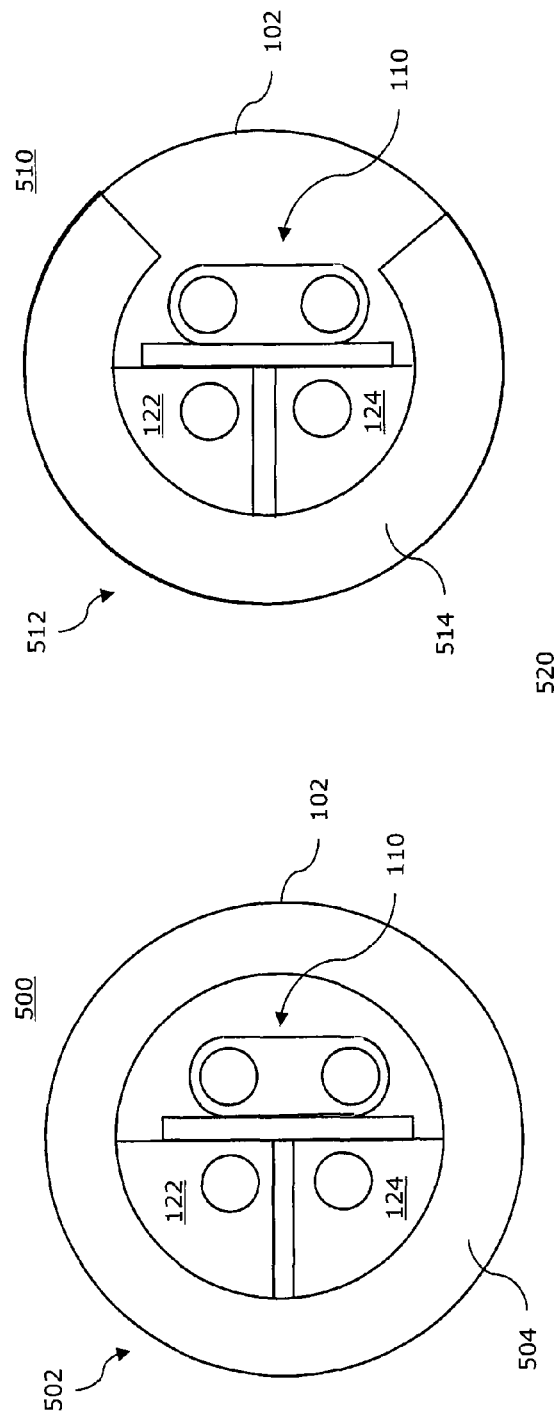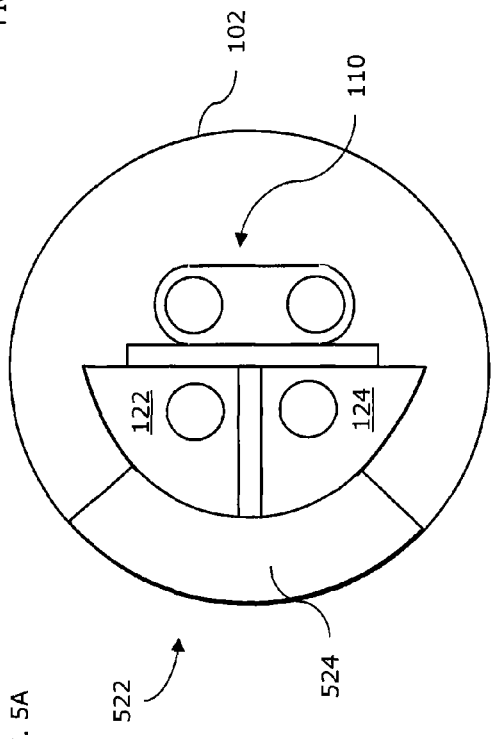

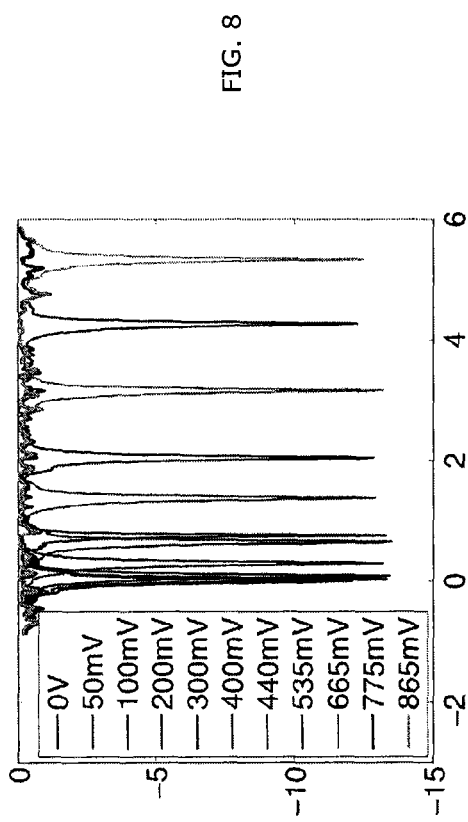
FIG. 8
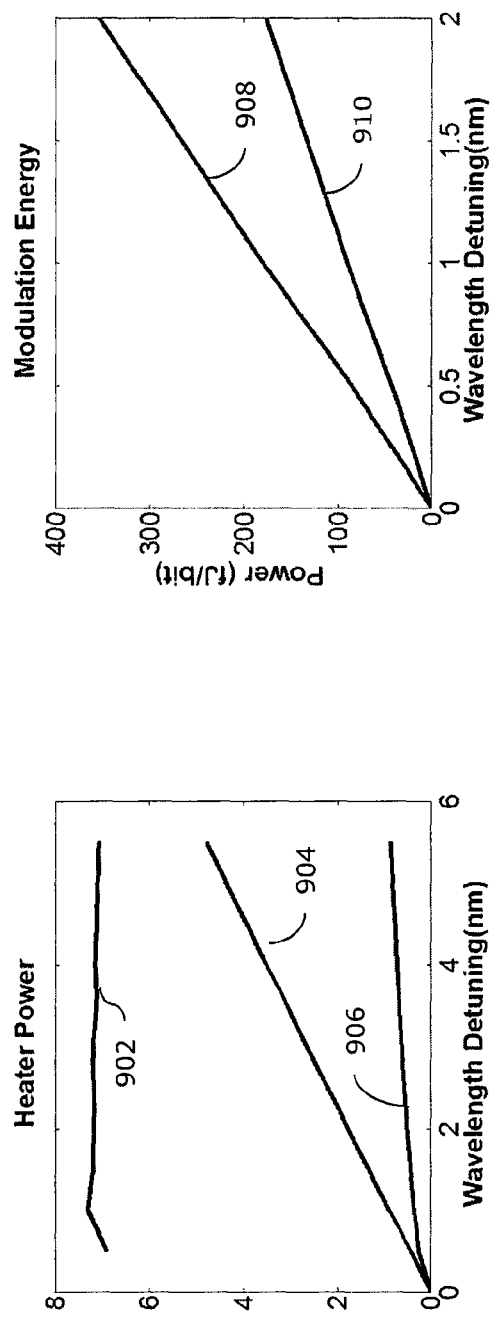
FIG. 9B
FIG. 9A

SILICON PHOTONIC HEATER-MODULATOR

CROSS REFERENCE TO RELATED APPLICATIONS

This application is related to and claims the benefit of U.S. Provisional Application No. 61/599,759 entitled SILICON PHOTONIC HEATER-MODULATOR filed on Feb. 16, 2012, the contents of which are incorporated herein by reference.

STATEMENT REGARDING FEDERALLY SPONSORED RESEARCH

This invention was developed under Contract DE-AC04-94AL85000 between Sandia Corporation and the U.S. Department of Energy. The U.S. Government has certain rights in this invention.

FIELD OF THE INVENTION

The present invention is directed generally to silicon photonic modulators with integral heaters, and, more particularly, to high speed silicon photonic disk modulators with integral heaters.

BACKGROUND OF THE INVENTION

For exascale computing, massive reduction in the energy used to transport data to and from memory and between processors, along with a commensurate increase in the amount of data per fiber, may enable devices that are manageable in power consumption and in the number of fiber interconnections. Solutions being developed to accomplish this include low power vertical cavity surface emitting lasers (VCSELs), silicon-bonded edge emitting lasers and external modulation technology utilizing silicon photonics.

Silicon photonics, for example, offer wavelength division multiplexing (WDM) capability integrated into the chip stack and may be compatible with legacy silicon foundries. In addition, with silicon photonics, a laser source may be provided separate from the chip, thus allowing the chip to be isolated from heat produced by the laser source. Low power silicon photonics, however, typically rely on resonators that may be sensitive to local temperature swings. Thus, a resonance frequency of silicon-based resonators may shift with variation in temperature.

SUMMARY OF THE INVENTION

The present invention is embodied in a photonic modulator. The photonic modulator includes a disk resonator having a central axis extending along a thickness direction of the disk resonator. The disk resonator includes a modulator portion and a heater portion. The modulator portion extends in an arc around the central axis. A PN junction of the modulator portion is substantially normal to the central axis.

The present invention is also embodied in a method of forming a photonic modulator. The method includes forming a disk resonator. The disk resonator has a central axis extending along a thickness direction of the disk resonator. The method also includes forming a heater portion in a first region of the disk resonator and forming a modulator portion in a second region of the disk resonator such that the modulator portion extends in an arc around the central axis of the disk resonator. A PN junction of the modulator portion is formed substantially normal to the central axis.

The present invention is further embodied in a method of modulating an input optical signal. The method includes providing the input optical signal to a waveguide and coupling the input optical signal to a disk resonator via the waveguide. The disk resonator includes a modulator portion and a heater portion. The modulator portion extends in an arc around a central axis of the disk resonator which extends along a thickness direction of the disk resonator. A PN junction of the modulator portion is substantially normal to the central axis. The method also includes setting an operating point of the disk resonator by the heater portion; modulating the input optical signal by the modulator portion to form an output optical signal; coupling the output optical signal from the disk resonator to the waveguide; and transmitting the output optical signal via the waveguide.

It is to be understood that both the foregoing general description and the following detailed description are exemplary, but are not restrictive, of the invention.

BRIEF DESCRIPTION OF THE DRAWINGS

The invention may be understood from the following detailed description when read in connection with the accompanying drawing. It is emphasized, according to common practice, that various features of the drawing may not be drawn to scale. On the contrary, the dimensions of the various features may be arbitrarily expanded or reduced for clarity. Moreover, in the drawing, common numerical references are used to represent like features. Included in the drawing are the following figures:

FIG. 3 is an overhead view diagram of an exemplary photonic modulator, according to another embodiment of the present invention;

FIG. 4A is an overhead view diagram of an exemplary photonic modulator, according to another embodiment of the present invention;

FIG. 4B is a cross-sectional view diagram of the photonic modulator shown in FIG. 4A along line 4B-4B, according to an embodiment of the present invention;

FIGS. 5A, 5B and 5C are overhead view diagrams of exemplary photonic modulators, according to example embodiments of the present invention;

FIG. 8 is an example graph of resonances as a function of wavelength detuning for various applied voltages for the photonic modulator shown in FIG. 1A, according to an embodiment of the present invention;

FIG. 9A is an example graph of heater power as a function of wavelength detuning for the photonic modulator shown in FIG. 1A, according to an embodiment of the present invention;

FIG. 9B is an example graph of modulation energy as a function of wavelength detuning for the photonic modulator shown in FIG. 1A, according to an embodiment of the present invention.

DETAILED DESCRIPTION OF THE INVENTION

As discussed above, low power silicon photonics generally rely on resonators that may be sensitive to local temperature swings. For modulators, heating is typically included in the total external modulation energy. Heating elements may be integrated with silicon photonics modulators, for example, to tune the resonance frequency of the modulator. Intimately integrated heating elements may provide high efficiency and fast response time on the order of a microsecond. Conventional integrated heating technology, however, show variation in extinction ratio with tuning and have a large footprint and corresponding large power requirements, needing, for example, up to 42 µW/GHz to tune.

Aspects of the present invention relate to photonic modulators and methods of producing a modulated optical signal. An exemplary photonic modulator includes a disk resonator having a modulator portion and a heater portion. The modulator and heater portions may be integrally formed in different regions of the disk resonator. According to an exemplary embodiment of the present invention, the modulator portion may extend in an arc around a central axis of the disk resonator. The modulator portion may include a PN junction that is substantially normal to the central axis (i.e., a vertical PN junction).

According to an exemplary embodiment of the present invention, the heater portion may include a resistive heating element formed by doping a material of the disk resonator. The photonic modulator may include an isolation region between the modulator portion and the heater portion to substantially electrically isolate the modulator and heater portions from each other. According to exemplary embodiments, the photonic modulator may modulate an input optical signal by applying drive signals to the modulator portion via AC coupling or differential signaling.

Disclosed herein is an exemplary photonic modulator that is an integrated heater-modulator. According to an exemplary embodiment, the integrated heater-modulator may be compatible with complementary metal-oxide semiconductor (CMOS) potentials of less than 1 V for both heating and modulation, desirably has flat resonance depth across a wide tuning range and may have a free spectral range (FSR) that covers the entire C-Band, as well as occupying a small area, i.e. 50 µm². An exemplary photonic modulator may include an efficiency of about 7 µW/GHz. An exemplary embodiment of the present invention may desirably be compatible with differential signaling. An exemplary architecture of the present invention combines both heating and modulation electronics within the disk resonator.

Figure 1A:
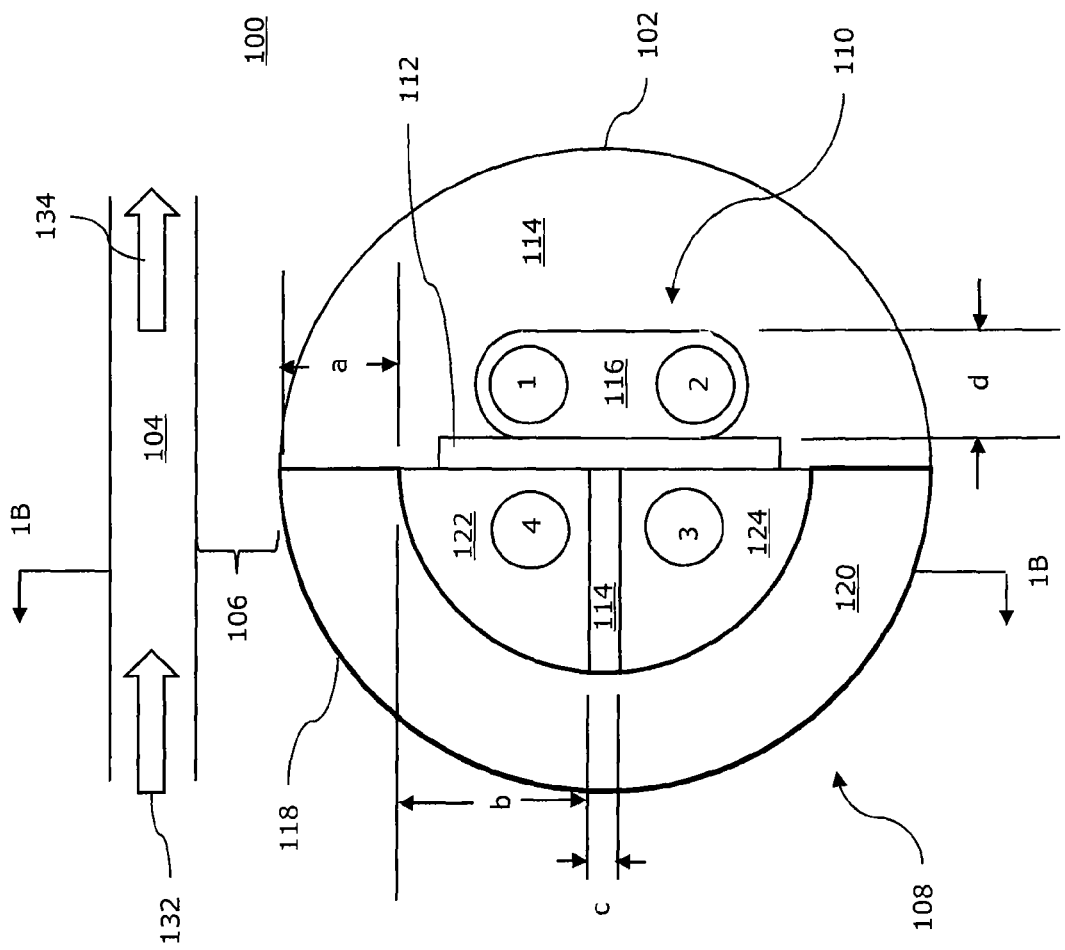
FIG. 1A is an overhead view diagram of an exemplary photonic modulator, according to an embodiment of the present invention.
Figure 1B:
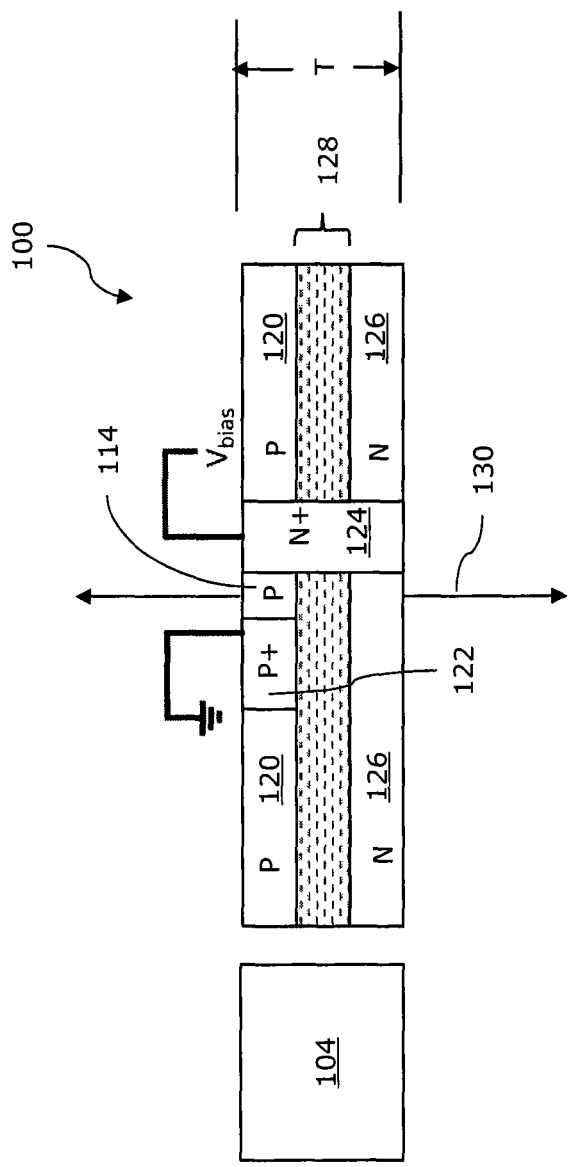
FIG. 1B is a cross-sectional view diagram of the photonic modulator shown in FIG. 1A along line 1B-1B illustrating signaling via alternating current (AC) coupling, according to an embodiment of the present invention.

Referring to FIGS. 1A and 1B, an exemplary photonic modulator 100 is shown. In particular, FIG. 1A is an overhead view diagram of photonic modulator 100; and FIG. 1B is a cross-sectional view diagram photonic modulator 100 along line 1B-1B. FIGS. 1A and 1B also illustrate waveguide 104 which may be separated from photonic modulator 100 by gap 106.

Photonic modulator 100 may include disk resonator 102 having modulator portion 108 and heater portion 110 each formed within disk resonator 102. In an exemplary embodiment, half of disk resonator 102 includes modulator portion 108 and the remaining half of disk resonator 102 may be reserved for heater portion 110. Although FIG. 1A illustrates modulator portion 108 as being formed within half (i.e., π radians) of disk resonator 102, modulator portion 108 is not limited to this arrangement, as described further below with respect to FIGS. 5A-5C and FIG. 6. In an exemplary embodiment, isolation region 112 may be formed between modulator portion 108 and heater portion 110. Isolation region 112 may include an oxide electrical isolation strip. In an exemplary embodiment, heater portion 110 may include resistive heating element 116 (described further below).

Disk resonator 102 of photonic modulator 100 may be formed of material 114. In an exemplary embodiment, material 114 includes silicon having a P-type doping concentration of about $10^{14}$ cm$^{-3}$. Disk resonator 102 may be formed of silicon, or other suitable CMOS compatible semiconductor materials. Possible materials of disk resonator 102 may include II/V and II/VI materials. In general, disk resonator 102 and waveguide 104 may each be formed of materials including, without being limited to, silicon, silicon nitride, indium phosphide, germanium, silica, fused quartz, sapphire, alumina, glass, gallium arsenide, silicon carbide, lithium niobate, silicon on insulator, germanium on insulator and silicon germanium. It is understood that the wavelength of the carrier wave (that is modulated) and photonic modulator 100 dimensions may be variable depending on the selected material.

Although not shown, photonic modulator 100 and waveguide 104 may be formed on a substrate. The substrate may include any suitable material including, but not limited to, silicon, indium phosphide, germanium, silica, fused quartz, sapphire, alumina, glass, gallium arsenide, silicon carbide, lithium niobate, silicon on insulator and germanium on insulator.

Although FIG. 1A illustrates disk resonator 102 having a circular symmetry, disk resonator 102 may include any disk microresonator capable of optically coupling light to and from waveguide 104, including, but not limited to oval and elliptical disk microresonators.

Modulator portion 108 includes PN junction region 118, first ohmic contact region 122 and second ohmic contact region 124. First and second ohmic contact regions 122, 124 may be separated by material 114 of disk resonator 102. First and second ohmic contact regions 122, 124 may be formed adjacent to each other and parallel to a surface of photonic modulator 100 extending substantially normal to central axis 130 (FIG. 1B).

As shown in FIG. 1B, disk resonator 102 includes central axis 130 extending along a thickness direction of disk resonator 102 (having thickness T). As shown in FIG. 1A, PN junction region 118 of disk resonator extends in an arc around central axis 130 (FIG. 1B) of disk resonator 102. For example, FIG. 1A illustrates the arc as being about π radians. In general, PN junction region 118 may extend in an arc around central axis 130 between about π/4 radians to about 2π radians.

As shown in FIG. 1B, PN junction region 118 includes P-type doped region 120 and N-type doped region 126. A PN junction between P-type doped region 120 and N-type doped region 126 may be a vertical PN junction (i.e., substantially normal to central axis 130). FIG. 1B also illustrates the positions of first ohmic contact region 122 and second ohmic contact region 124 relative to P-type doped region 120, N-type doped region 126 and (disk resonator) material 114.

In an exemplary embodiment, P-type doped region 120 and N-type doped region 126 have opposite doping concentrations of about $10^{18}$ cm$^{-3}$. First ohmic contact region 122 may be a highly doped P$^+$-type region and second ohmic contact region 124 may be a highly doped N$^+$-type region. In an exemplary embodiment, first and second ohmic contact regions 122, 124 may have opposite doping concentrations of about $10^{20}$ cm$^{-3}$.

FIG. 1A illustrates electrical contacts 1-4 on respective resistive heating element 116 and ohmic contact regions 122, 124. Contacts 1, 2 may be used to provide drive signals to control heater portion 110, while contacts 3, 4 may be used to provide drive signals to control modulator portion 108 (described further below with respect to FIGS. 1B and 2).

A thermo-optic effect may be used to change the refractive index of disk resonator 102, so that the operating point of disk resonator 102 may be thermally tuned. In an exemplary embodiment, heater portion 110 of disk resonator 102 may include an integral resistive heating element 116. Resistive heating element 116 may be formed by doping material 114 of disk resonator 102 within heater portion 110. In an exemplary embodiment, resistive heating element 116 may be formed by a conductive stripe doped to $10^{18}$ cm$^{-3}$ with phosphorus (N-type) implants. The arc, e.g. an arc of π radians, that contains the modulation electronics is moved to one side of the disk while the other half of the inner ohmic contact region is reserved for the heating element. The heater is a simple design consisting of the ohmic contact regions joined together by the conductive stripe. Heater portion 110 may include any suitable conductive element or elements to induce a change in temperature of disk resonator 102, via contacts 1 and 2. In general, heater portion 110 may be doped to achieve a desired resistance in response to a current applied between contacts 1 and 2. It is understood that heater portion 110 is not limited to the shape illustrated in FIG. 1A and may be formed from any suitable shape and doping concentration to achieve a desired change in temperature of disk resonator 102.

Although FIG. 1A illustrates heater portion 110 having resistive heating element 116, heater portion 110 may include a P-type doped region and an N-type doped region coupled to contacts 1 and 2, which may be electronically controlled by injected carriers or by applying an electric field. When a forward bias is applied to contacts 1 and 2, carriers may be injected into disk resonator 102. The injected carriers may increase the effective refractive index of disk resonator 102, causing a change of the resonant frequency (and changing the operating point).

As discussed above, heater portion 110 may be used to tune an operating point of disk resonator 102. According to an exemplary embodiment, heater portion 110 may also be used to hold a temperature of disk resonator 102 steady in a varying environment. For example, heater portion 110 may be coupled to a feedback control circuit that monitors the environment and may adjust a temperature of heater portion 110 in response to the changing thermal conditions of the environment. Heater portion 110 may also be used to tune disk resonator 102 to compensate for manufacturing process variations of photonic modulator 100.

Photonic modulator 100 may be formed of a suitable size so that photonic modulator 100 may produce a desired modulation. In an exemplary embodiment, photonic modulator 100 may have a diameter of about 4.2 µm and may be formed of a thickness T (FIG. 1B) of about 250 nm silicon on 3 µm of buried oxide, with 5 µm of oxide deposited over photonic modulator 104. In an exemplary embodiment, PN junction region 118 has a width (a) of about 0.8 µm; ohmic contact regions 122, 124 each have a radius (b) of 0.9 µm; ohmic contact regions 122, 124 are separated by a distance (c) of about 0.6 µm; heater portion 110 has a width (d) of about 0.7 µm; and isolation region 112 has a width of about 0.6 µm. In general, an upper bound diameter of photonic modulator 100 may be selected based on a size of the substrate. A lower bound diameter of photonic modulator 100 may be selected based on the coupled frequency and material of photonic modulator 100. According to an exemplary embodiment, a diameter of photonic modulator 100 may be formed between about 1 µm to about 300 mm.

In operation, waveguide 104 may receive input optical signal 132. Input optical signal 132 may be coupled into disk resonator 102 of photonic modulator 100 and back out of disk resonator 102 into waveguide 104. Waveguide 104 may transmit output optical signal 134 which is modulated via modulator portion 108. An operating point of disk resonator may be set by heater portion 110.

The transmission of light in waveguide 104 may be sensitive to the wavelength of input optical signal 132, and may be greatly reduced at wavelengths in which the circumference of disk resonator 102 corresponds to an integer number of guided wavelengths (i.e., a resonance condition of disk resonator 102). By tuning the effective index of disk resonator 102, the resonance wavelength of disk resonator 102 may be modified, thus inducing a modulation of input optical signal 102. The modulation is equivalent to a shift between a resonance condition (where a maximum amount of optical energy accumulates in disk resonator 102) and a non-resonance condition (where a reduced amount of optical energy may accumulate in disk resonator 102).

Modulator portion 108 may control the density of free charge carriers, which may alter the effective index of disk resonator 102. As light in disk resonator 102 passes through PN junction region 118 of modulator portion 108, carriers may be injected or removed (i.e., depleted) by altering the polarity of an applied voltage (via contacts 3 and 4), causing the light to be modulated:

Although FIG. 1A illustrates a single waveguide 104, it is understood that photonic modulator 100 may be coupled to an input waveguide and an output waveguide which may be separate from the input waveguide. Although waveguide 104 is illustrated as being side-coupled to photonic modulator 100, it is understood that waveguide 104 may be coupled to a top or bottom surface of photonic modulator 100.

FIG. 1B illustrates photonic modulator 100 configured for signaling via AC coupling. First ohmic contact region'122 is electrically connected to ground (via electrical contact 4 shown in FIG. 1A). Second ohmic contact region 124 is electrically connected to an AC drive signal ($V_{bias}$) (via electrical contact 3 shown in FIG. 1A). By applying an AC drive signal, modulator portion may operate in both forward and reverse bias operation, providing both carrier injection and carrier depletion in region 128. In general, photonic modulator 100 may be forward biased and/or reverse biased using AC coupling or direct current (DC) coupling with single ended signaling or differential signaling, or any combination thereof.

Figure 2:
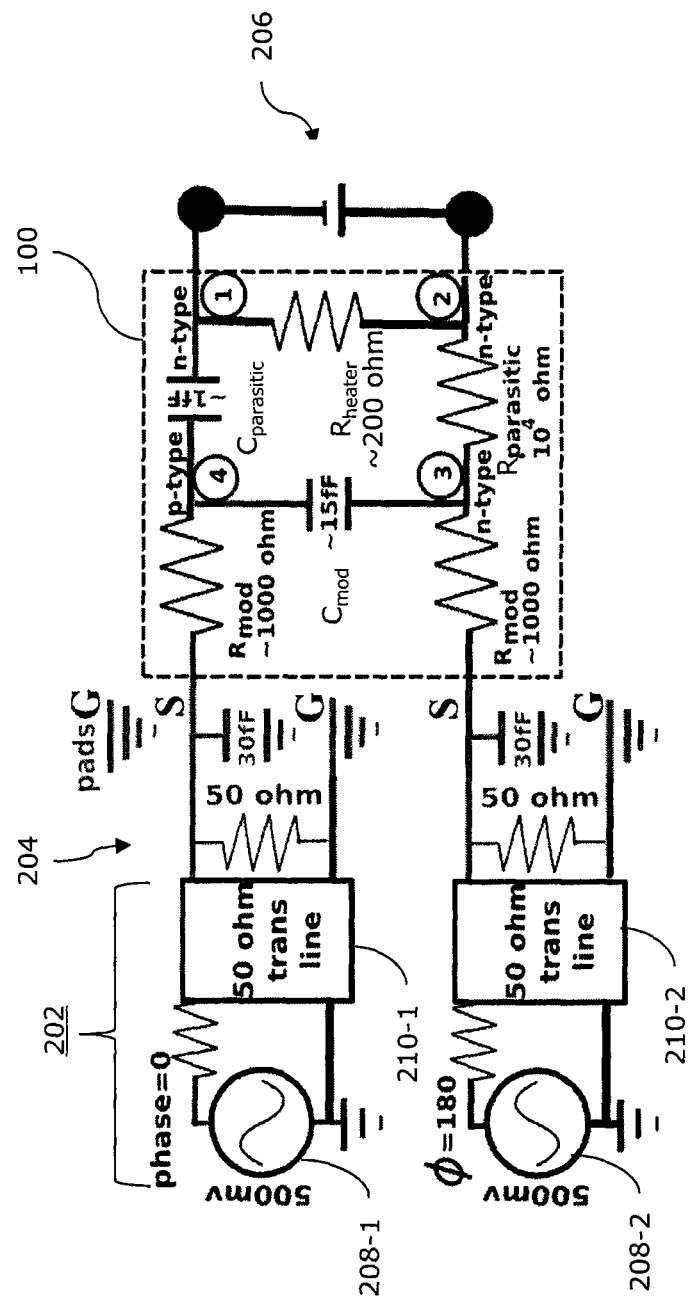
FIG. 2 is a circuit diagram of the photonic modulator shown in FIG. 1A configured for differential signaling, according to an embodiment of the present invention.

FIG. 2 is a circuit diagram of photonic modulator 100 configured for differential signaling. FIG. 2 illustrates electrical contacts 1-4 of respective heater portion 110 and modulator portion 108. Contacts 1 and 2 of heater portion 110 may be electrically connected to heater supply 206. Contacts 3 and 4 of modulator portion 108 may be electrically connected to source network 202 via probe 204. FIG. 2 also illustrates example resistance values ($R_{heater}$, $R_{parasitic}$, $R_{mod}$) and capacitance values ($C_{mod}$, $C_{parasitic}$) between contacts 1-4, as well as between contacts 3 and 4 and probe 204.

Source network 202 includes AC signal sources 208-1, 208-2 coupled to respective electrical contacts 4 and 3 of photonic modulator 100 via respective transmission lines 210-1, 210-2 and probe 204. AC signal sources 210-1, 210-2 may produce AC signals having a same amplitude (for example, 500 mV), which may be 180° out of phase with each other. According to an exemplary embodiment, in a differential driving scheme, the voltage on each transmission line 210-1, 210-2 may be cut in half using AC signals with matched phase (i.e., 180° out of phase), to generate two times the differential voltage swing on each transmission line 210-1, 210-2. Differential signaling may be readily integrated with different low voltage differential signaling (LVDS) regimes (e.g., positive emitter-coupled logic (PECL), emitter-coupled logic (ECL), voltage mode logic (VML), current mode logic (CML), etc.). Differential signaling may enable the use of very low voltage drivers (typically half of the voltage normally used), such as CMOS inverters.

Referring next to FIG. 3, an overhead view diagram of photonic modulator 300 is shown, according to another exemplary embodiment of the present invention. Photonic modulator 300 is similar to photonic modulator 100 (FIG. 1A), except that photonic modulator 300 may not include an isolation region (such as isolation region 112 shown in FIG. 1A). For example, depending upon the amount of electrical isolation desired between modulator portion 108 and heater portion 110, an isolation region may not be necessary.

Referring next to FIGS. 4A and 4B, photonic modulator 400 is shown, according to another exemplary embodiment of the present invention. In particular, FIG. 4A is an overhead view diagram of photonic modulator 400; and FIG. 4B is a cross-sectional view diagram photonic modulator 400 along line 4B-4B. Photonic modulator 400 is similar to photonic modulator 300 (FIG. 3), except that photonic modulator 400 may include modulator portion 108' having vertical ohmic contact region 402.

Vertical ohmic contact region 402 may include first ohmic contact region 404 and second ohmic contact region 406 arranged adjacent to each other and parallel to central axis 130 of disk resonator 102. In an exemplary embodiment, first ohmic contact region 404 may be a highly doped P$^+$-type region and second ohmic contact region 406 may be a highly doped N$^+$-type region. First ohmic contact region 404 and second ohmic contact region 406 are similar to respective first ohmic contact region 122 (FIG. 1A) and second ohmic contact region 124, except for the vertical arrangement of first ohmic contact region 404 and second ohmic contact region 406.

Referring next to FIGS. 5A-5C, overhead view diagrams of respective photonic modulators 500, 510 and 520 are shown, according to exemplary embodiments of the present invention. Photonic modulators 500, 510 and 520 are similar to photonic modulator 100 (FIG. 1A), except that the respective arc lengths of PN junction regions 504, 514, and 524 are different from the arc length of PN junction region 118.

In FIG. 1A, PN junction region 118 of modulator portion 108 extends around central axis 130 by about π radians. In FIG. 5A, PN junction region 504 of modulator portion 502 extends around central axis 130 by 2π radians (i.e., around the entire circumference of disk modulator 102. In FIG. 5B, PN junction region 514 of modulator portion 512 extends around central axis 130 by about 3π/2 radians. In FIG. 5C, PN junction region 524 of modulator portion 522 extends around central axis 130 by about π/2 radians.

Figure 6:
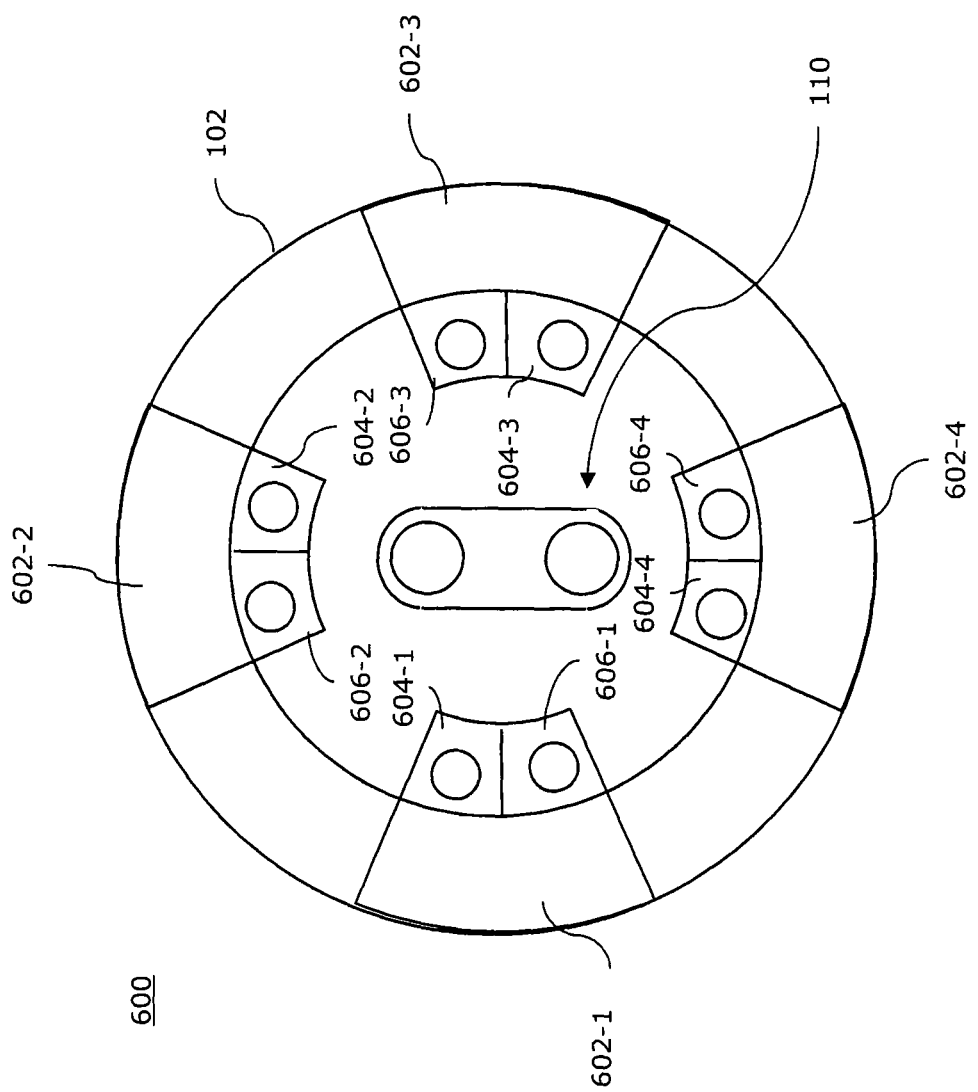
FIG. 6 is an overhead view diagram of an exemplary photonic modulator having multiple modulator portions, according to an embodiment of the present invention.

Referring next to FIG. 6, an overhead view diagram of photonic modulator 600 is shown, according to another exemplary embodiment of the present invention. Photonic modulator 600 is similar to photonic modulator 100 (FIG. 1A), except that photonic modulator 600 may include a plurality of modulator portions 602 (for example, four modulator portions 602-1, 602-2, 602-3 and 602-4) separated from each other and extending in respective arcs around a central axis (such as central axis 130 shown in FIG. 1B). In photonic modulator 600, heater portion 110 is illustrated as being in a center of disk resonator 102.

Each modulator portion 602 may include respective first ohmic contact region 604 and second ohmic contact region 606, where each second ohmic contact region 606 has an opposite doping concentration from each first ohmic contact region 604. In photonic modulator 100 (FIG. 1A), resistance flowing from PN junction region 118 back to contacts 3 and 4 may be high because of the long path along the upper and lower layers of PN junction region 118. The high resistance may slow carrier extraction and injection. Photonic modulator 600 may reduce the resistance by radially connecting multiple contacts (via multiple ohmic contact regions 604, 606). The use of multiple modulator contacts may increase a reliability of photonic modulator 600.

The invention will next be illustrated by reference to an example. The example is included to more clearly demonstrate the overall nature of the invention. The example is exemplary, not restrictive of the invention.

Example

Figure 7:
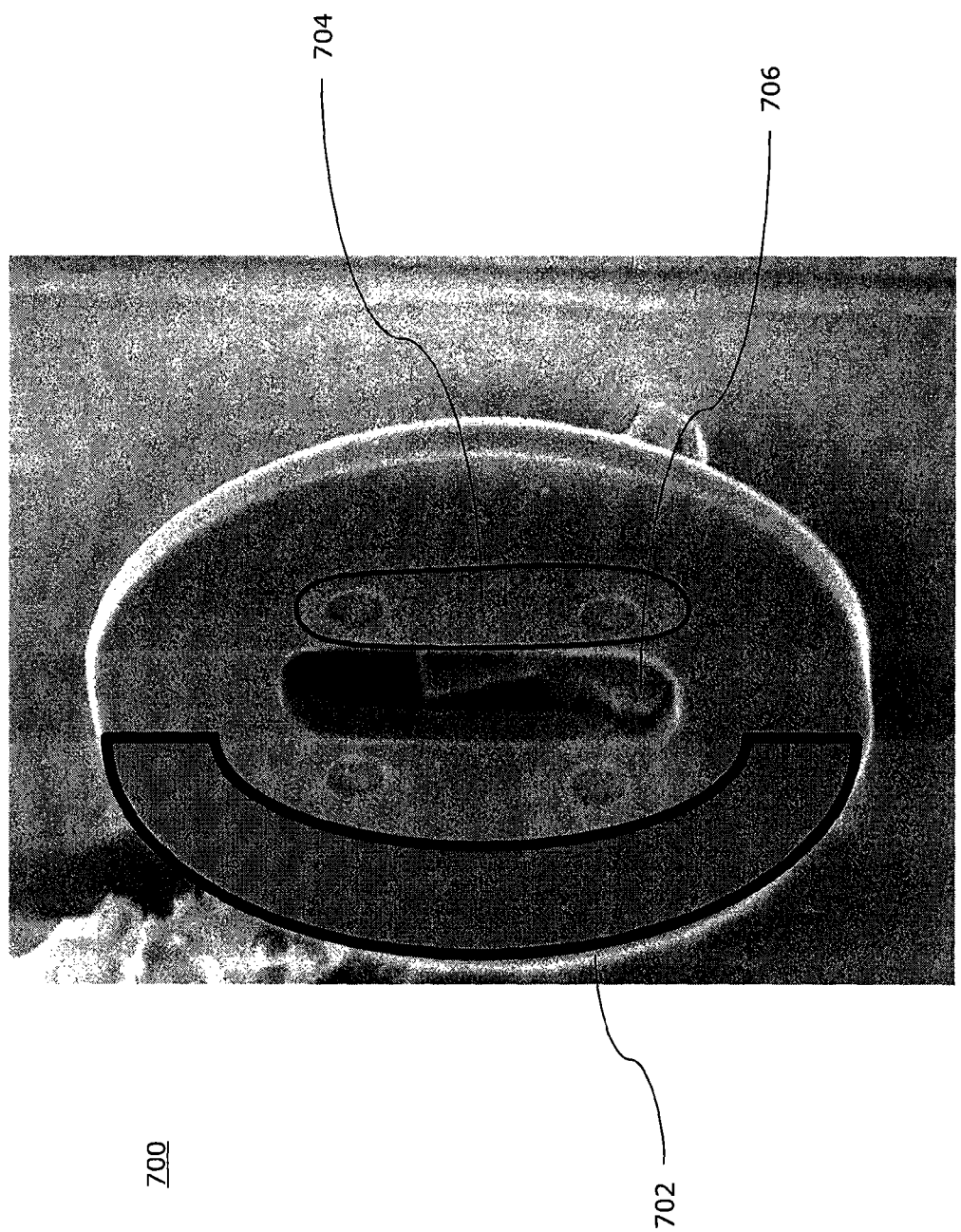
FIG. 7 is a marked-up scanning electron microscope (SEM) image of an exemplary photonic modulator, according to an embodiment of the present invention.

FIG. 7 is an example marked-up scanning electron microscope (SEM) image of photonic modulator 700, according to an embodiment of the present invention. Photonic modulator 700 is about 4 μm in diameter and has a thickness of about 250 nm silicon on 3 μm of buried oxide. The SEM image illustrates photonic modulator portion 702, heater portion 704 and isolation region 706.

In the example, reference is made to photonic modulator 100 shown in FIG. 1A. In the example, photonic modulator 100 has the exemplary dimensions described above with respect to FIG. 1A. The drive signal line configuration and pad layout of photonic modulator 100 may be designed to utilize differential signaling (shown in FIG. 2) and therefore may operate with a 500 mV CMOS supply rail.

Heater portion 704 is tested using single point direct current (DC) probes. A DC voltage is applied to heater portion 704 and current is measured using a Kiethley 5300 sourcemeter. The modulation performance is examined through the use of an Agilent 8164B tunable laser source (1550 nm) and probing is done using GSGSG Cascade Microtech probes with one signal line grounded.

Referring to FIG. 8, an example graph of resonances as a function of wavelength detuning for various applied voltages for photonic modulator 100 are shown. The resonances in FIG. 8 for 5 nm of detuning are shown with consistent resonance depth, which varies by less than 1.5 dB across the running range. The resonance depths are all within 1.5 dB of each other with a quality factor (Q) of about $10^4$. This is an important outcome because while modulator temperature is desirably constant, each modulator will be tuned to a channel against manufacturing and environmental variation. Variation in extinction ratio due to tuning may incur a built in variable power penalty and cause the inclusion of another layer of compensation on the receiver side to balance the system.

Referring to FIG. 9A, an example graph of heater power as a function of wavelength detuning for photonic modulator 100 is shown. In FIG. 9A, efficiency curve 902 is in units of μW/GHz, power curve 904 is in units of mW and voltage curve 906 is in units of V. FIG. 9A shows the power 904 consumed by the heater-modulator and the voltage 906 used to achieve a wavelength shift. The efficiency curve 902 shows a stable 7 µW/GHz while the increase in power 904 is seen to be linear across 5 nm of wavelength detuning. As shown in FIG. 9A, the voltage 906 used does not rise above 1 V.

Referring to FIG. 9B, an example graph of modulation energy as a function of wavelength detuning for photonic modulator 100 is shown. Taking power 904 (FIG. 9A) and dividing it by the bit rate yields the energy/bit shown in FIG. 9B. Both 5 Gbps operation 908 and 10 Gbps operation 910 are shown. Tuning over such a wide wavelength range may be unlikely. Using a conservative estimate for the required trimming for manufacturing tolerance and tuning for thermal variation, an estimate for realistic operation may be calculated to be about 180 fJ/bit (using 535 mV) which may be compatible even with projected low power CMOS applications. The estimate assumes about 80 GHz of manufacturing variation and a total environmental temperature swing of about 40° C., where about 10 GHz/° C. is used for the shift in the resonance for wavelengths around 1550 nm in silicon. Note that if these variations are random within a bound and Gaussian, as is expected, then on average only half of either variation may be compensated for. The Gaussian shape of the distribution of manufacturing variation may result in only half of the variation being compensated for. This is because the average of the Gaussian is only half the distance away from either of the extreme cases of variation. Therefore, the average distance from a targeted design specification may be half of the distribution.

High speed testing is performed by grounding the N-type ohmic contact (contact 3) and driving the P-type modulator contact (contact 4) into reverse bias using DC coupling with a pseudo-random bit sequence (PRBS) of $2^{31}$-1 (as shown in FIG. 1B, where $V_{bias}$ equals PRBS). The heater contact closest to the modulator N-type contact (contact 2) is also grounded providing reverse bias from contact 4 to the rest of photonic modulator 100 and no current between contacts 2 and 3. The PRBS signal amplitude driven into contact 4 is 1 V in. Photonic modulator 100 may also be run differentially (as shown in FIG. 2), although this may cause the total signal amplitude to increase progressively to 1.3 V at 5 nm (60 µV/nm) of tuning to compensate for heater parasitics to the modulation contacts (contacts 3 and 4).

Figure 10C:
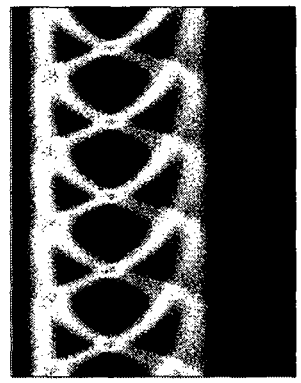
FIGS. 10A, 10B, 10C, 10D, 10E and 10F are example eye diagrams for the photonic modulator shown in FIG. 1A for various operating conditions, according to embodiments of the present invention.
Figure 10F:
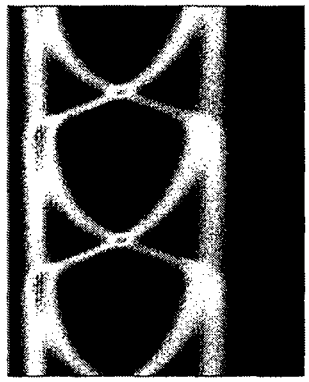
Figure 10B:
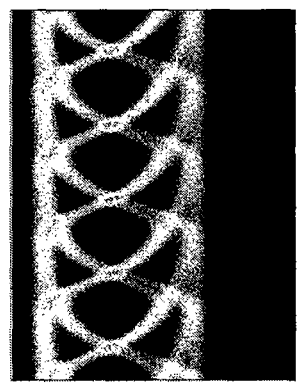
Figure 10E:
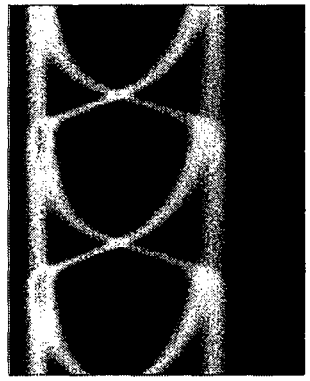
Figure 10A:
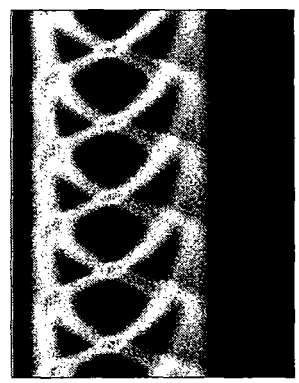
Figure 10D:
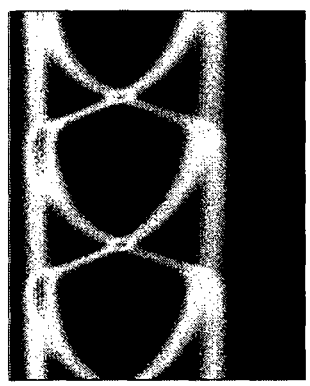

Modulation may be performed with the heater running at progressively higher power resulting in the tuning described in FIG. 8. FIGS. 10A-10F are example eye diagrams for photonic modulator 100 for various operating conditions. FIGS. 10A-10C are modulation results for 10 Gbps operation and FIGS. 10D-10F are modulation results for 5 Gbps operation, using a $2^{31}$-1 PRBS signal.

The detuning is 0 nm in FIGS. 10A and 10D; 2 nm in FIGS. 10B and 10E; and 5 nm in FIGS. 10C and 10F. The temperature change is 0° C. in FIGS. 10A and 10D; 25° C. in FIGS. 10B and 10E; and 64° C. in FIGS. 10C and 10F. The applied heater potential is 0 mV in FIGS. 10A and 10D; 535 mV in FIGS. 10B and 10E; and 865 mV in FIGS. 10C and 10F. The applied heater current is 0 mA in FIGS. 10A and 10D; 3.4 mA in FIGS. 10B and 10E; and 5.24 mA in FIGS. 10C and 10F. Applied modulation voltages for each of FIGS. 10A-10F are 1V, 1.12V and 1.3V (from left to right). Extinction ratios are 3 dB for 10 Gbps and 4 dB for 5 Gbps.

The 10 Gbps measured bit error rate is at $10^{-9}$ and less than $10^{-12}$ for $2^{31}$-1 and $2^{15}$-1 PRBS patterns respectively. The modulator running at 5 Gbps with PRBS $2^{31}$-1 has a bit error rate (BER) of less than $10^{-12}$. The higher BER at 10 Gbps may be due to a bandwidth limitation, which is illustrated in the peaked eye diagram. As discussed above, resistance from the PN junction region back to contacts 3, 4 may be high, which may slow carrier extraction and injection. This issue may be resolved by radially connecting twice the number of contacts.

The consistency of modulator performance across temperatures may be confirmed by measuring the power penalties for both the modulator when it is heated by the integrated heater portion and the modulator heated by a (external) thermo-electric cooler (TEC). As is consistent with the eye diagrams (FIGS. 10A-10F) and the repeatable resonance depth, a 0-2 dB power penalty is measured for all of the tuning voltages in FIG. 8 using both the TEC and integrated heater portion.

The above example demonstrates an exemplary photonic modulator (a 4 µm silicon photonic vertical junction integrated heater modulator), that may function at 10 Gbps, and which includes quantification of heating on BER and the energy/bit. Among the unique characteristics of the exemplary photonic modulator are flat resonance depth, low power penalty, small footprint (50 µm$^2$) and heater voltages compatible with future CMOS technology. This results in an efficiency of about 7 µW/GHz in a heater for wavelength recovery in narrow band resonant modulator devices.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A photonic modulator comprising:
   a disk resonator having a central axis extending along a thickness direction of the disk resonator,
   wherein the disk resonator includes a modulator portion and a heater portion, the modulator portion extending in an arc around the central axis, a PN junction of the modulator portion being substantially normal to the central axis; and
   wherein the disk resonator has an inner region and an outer region, the modulator portion is disposed in the outer region, the modulator portion has at least two ohmic contact regions, the heater portion has at least two ohmic contact regions, and the heater portion, the heater ohmic contact regions, and the modulator ohmic contact regions are disposed in the inner region of the disk resonator.

2. The photonic modulator of claim 1, wherein the disk resonator is formed of at least one of silicon, silicon nitride, indium phosphide, germanium, silica, fused quartz, sapphire, alumina, glass, gallium arsenide, silicon carbide, lithium niobate, silicon on insulator, germanium on insulator and silicon germanium.

3. The photonic modulator of claim 1, wherein the arc around the central axis of the disk resonator through which the modulator portion extends is equal to between about π/4 radians to about 2π radians.

4. The photonic modulator of claim 1, wherein the heater portion of the disk resonator includes an integral resistive heating element.

5. The photonic modulator of claim 1, wherein the disk resonator includes an isolation region between the modulator portion and the heater portion to substantially electrically isolate the modulator portion from the heater portion.

6. The photonic modulator of claim 1, wherein the modulator portion includes a plurality of modulator portions, the plurality of modulator portions spaced apart from each other and extending in respective arcs around the central axis.

7. The photonic modulator of claim 1, wherein the modulator portion includes:
a PN junction region including the PN junction, the PN junction region extending in the arc around the central axis, and
first and second ohmic contact regions adjacent to the PN junction region, the first and second ohmic contact regions having opposite doping concentrations.

8. The photonic modulator of claim 7, wherein the disk resonator includes a surface substantially normal to the central axis, the first and second ohmic contact regions being arranged adjacent to each other and parallel to the surface of the disk resonator.

9. The photonic modulator of claim 7, wherein the first and second ohmic contact regions are arranged adjacent to each other and parallel to the central axis of the disk resonator.

10. The photonic modulator of claim 1, wherein an operating point of the disk resonator is tunable using a thermo-optic effect via the heater portion.

11. The photonic modulator of claim 1, wherein the photonic modulator is modulated by at least one of carrier injection or carrier depletion via the modulator portion.

12. A method of forming a photonic modulator, the method comprising:
forming a disk resonator, the disk resonator having a central axis extending along a thickness direction of the disk resonator;
forming a heater portion in a first region of the disk resonator; and
forming a modulator portion in a second region of the disk resonator such that the modulator portion extends in an arc around the central axis of the disk resonator, a PN junction of the modulator portion being formed substantially normal to the central axis;
wherein the disk resonator is formed with an inner region and an outer region, the modulator portion is disposed in the outer region, the modulator portion is formed with at least two ohmic contact regions, the heater portion is formed with at least two ohmic contact regions, and the heater portion, the heater ohmic contact regions, and the modulator ohmic contact regions are formed in the inner region of the disk resonator.

13. The method of claim 12, wherein the arc around the central axis of the disk resonator through which the modulator portion extends is equal to between about $\pi/4$ radians to about $2\pi$ radians.

14. The method of claim 12, wherein the forming of the heater portion includes doping a material of the first region of the disk resonator to form a resistive heating element.

15. The method of claim 12, wherein the forming of the modulator portion includes forming a plurality of modulator portions in the disk resonator, the plurality of modulator portions being spaced apart from each other and extending in respective arcs around the central axis.

16. The method of claim 12, further comprising forming an isolation region in the disk resonator between the modulator portion and the heater portion to substantially electrically isolate the modulator portion from the heater portion.

17. The method of claim 12, wherein the forming of the modulator region includes:
forming a PN junction region including the PN junction, the PN junction region extending in the arc around the central axis, and
forming first and second ohmic contact regions adjacent to the PN junction region, the first and second ohmic contact regions having opposite doping concentrations.

18. The method of claim 17, wherein the disk resonator includes a surface substantially normal to the central axis, the first and second ohmic contact regions being arranged adjacent to each other and parallel to the surface of the disk resonator.

19. The method of claim 17, wherein the first and second ohmic contact regions are arranged adjacent to each other and parallel to the central axis of the disk resonator.

20. A method of modulating an input optical signal, the method comprising:
providing the input optical signal to a waveguide;
coupling the input optical signal to a disk resonator via the waveguide, the disk resonator including a modulator portion and a heater portion, the modulator portion extending in an arc around a central axis of the disk resonator which extends along a thickness direction of the disk resonator, a PN junction of the modulator portion being substantially normal to the central axis;
setting an operating point of the disk resonator by the heater portion;
modulating the input optical signal by the modulator portion to form an output optical signal;
coupling the output optical signal from the disk resonator to the waveguide; and
transmitting the output optical signal via the waveguide;
wherein the disk resonator has an inner region and an outer region, the modulating step is performed by applying an electric signal to at least two ohmic contact regions situated in the inner region resulting in the activation of a modulator portion disposed in the outer region, and the operating-point-setting step is performed by applying an electric signal to at least two further ohmic contact regions situated in the inner region resulting in the activation of a heater portion disposed in the inner region of the disk resonator.

* * * * *